(12) United States Patent
Yoshinaga et al.

(10) Patent No.: US 7,791,677 B2
(45) Date of Patent: Sep. 7, 2010

(54) DISPLAY APPARATUS

(75) Inventors: Hideki Yoshinaga, Yokohama (JP); Hideo Mori, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 146 days.

(21) Appl. No.: 11/755,220

(22) Filed: May 30, 2007

(65) Prior Publication Data

US 2007/0284596 A1  Dec. 13, 2007

(30) Foreign Application Priority Data

Jun. 7, 2006  (JP)  ............................. 2006-157996

(51) Int. Cl.
*G02F 1/1343* (2006.01)

(52) U.S. Cl. ...................................................... 349/38

(58) Field of Classification Search ................ None
See application file for complete search history.

(56) References Cited

U.S. PATENT DOCUMENTS

| | | | | |
|---|---|---|---|---|
| 3,612,758 A | | 10/1971 | Evans et al. ............... 178/5.4 R |
| 4,643,530 A | * | 2/1987 | Yamazaki ..................... 349/43 |
| 5,182,661 A | * | 1/1993 | Ikeda et al. ................... 349/38 |
| 5,576,858 A | * | 11/1996 | Ukai et al. .................... 349/42 |
| 5,729,315 A | | 3/1998 | Takahashi et al. ........... 349/149 |
| 6,266,119 B1 | | 7/2001 | Takahashi et al. ........... 349/149 |
| 6,271,543 B1 | * | 8/2001 | Ohtani et al. .................. 257/72 |
| 6,326,981 B1 | | 12/2001 | Mori et al. ................... 345/695 |
| 6,507,375 B1 | * | 1/2003 | Kawahata ..................... 349/38 |
| 6,674,421 B2 | | 1/2004 | Mori et al. .................... 345/96 |
| 6,961,038 B2 | | 11/2005 | Yoshinaga et al. ............ 345/88 |
| 2002/0145140 A1 | * | 10/2002 | Katayama ..................... 257/59 |
| 2003/0117559 A1 | * | 6/2003 | Kim et al. .................... 349/141 |
| 2006/0050208 A1 | * | 3/2006 | Enomoto et al. ............. 349/114 |
| 2006/0146243 A1 | * | 7/2006 | Nakanishi et al. ........... 349/139 |
| 2007/0159563 A1 | * | 7/2007 | Moriwaki ..................... 349/38 |
| 2007/0205972 A1 | | 9/2007 | Asao et al. .................... 345/88 |
| 2008/0122772 A1 | * | 5/2008 | Takeuchi et al. .............. 345/89 |

FOREIGN PATENT DOCUMENTS

JP  9-211499  8/1997

* cited by examiner

*Primary Examiner*—Mike Stahl
(74) *Attorney, Agent, or Firm*—Fitzpatrick, Cella, Harper & Scinto

(57) ABSTRACT

Provided is a novel structure of an active matrix TFT backplane. In order to form an auxiliary capacitor by a pixel electrode or a drain electrode of a TFT connected therewith, a base metal layer is formed on a glass substrate and a substrate insulating layer is formed on an entire surface thereof. By the structure, position alignment of the drain electrode with a counter electrode is unnecessary. An area for electrical capacitor formation is determined by size precision of the drain electrode, so a variation in electrical capacitance is suppressed to a small value.

7 Claims, 4 Drawing Sheets

DISPLAY APPARATUS

BACKGROUND OF THE INVENTION

1. Field of the Invention

The present invention relates to a display apparatus in which devices are driven based on data retained in auxiliary capacitors, and more particularly, to a display apparatus having a structure capable of obtaining a wide design margin in view of this point.

2. Description of the Related Art

In recent years, along with developments of information devices, needs for thin low-power consumption display apparatuses are increasing. Therefore, display apparatuses that meet those needs have been under active research and development. In particular, it is desirable to save power and space regarding a wearable personal computer (wearable PC) or an electronic notebook.

Many types of liquid crystals do not have a so-called memory property, so it is necessary to continuously apply a voltage to a liquid crystal during a display period. When, for example, the wearable PC is to be used in various environments, it is difficult to ensure reliability of a liquid crystal having the memory property.

An electrophoretic display apparatus has been proposed in U.S Pat. No. 3,612,758 as one type of a thin and light display system having the memory property. The electrophoretic display apparatus includes a pair of substrates arranged at a predetermined interval, an insulating fluid filled between the substrates, a large number of colored charged migration particles dispersed into the insulating fluid, and display electrodes provided in each pixel along the respective substrates.

In the electrophoretic display apparatus, colored charged migration particles are charged to one of a positive polarity and a negative polarity, so the particles are absorbed by any one of the display electrodes based on the polarity of a voltage applied between the display electrodes. A state where the colored particles are absorbed by an upper electrode so that the colored particles can be observed, and a state where the colored particles are absorbed by a lower electrode so that a color of the insulating liquid can be observed are switched based on the applied voltage to display various images. Such type of electrophoretic display apparatus is called a "vertical movement type".

An In-Plain type electrophoretic display apparatus as illustrated in FIGS. 4A and 4B has been proposed in Japanese Patent Application Laid-Open No. H09-211499.

The electrophoretic display apparatus does not have a structure in which the insulating liquid is sandwiched between the substrates as in the case of the vertical movement type but has a structure in which each of first electrodes 31 is provided along an interpixel shielding layer and a second electrode (reflecting electrode) 32 is arranged on an entire pixel display portion and covered with an insulating film in order to reflect incident light.

The insulating liquid is transparent. As illustrated in FIG. 4A, the second electrode 32 is covered with migration particles 30 to perform black display. As illustrated in FIG. 4B, the migration particles 30 are collected near the first electrodes 31, each of which is located between adjacent pixels, to expose the second electrode 32, thereby performing white display. An image can be displayed by controlling the polarity of the applied voltage for each pixel.

In many display apparatuses such as a liquid crystal display apparatus, an electrophoretic display apparatus, and an organic electroluminescence (EL) display apparatus, a liquid crystal, an electrophoretic liquid, or an organic EL material is provided above a substrate in which TFTs are formed (hereinafter referred to as TFT backplane). At least one of electrodes for driving the liquid crystal, the electrophoretic liquid, or the organic EL material is provided on the TFT backplane. An electrode of each of the TFTs (drain electrode in many cases) is connected with an electrode of a corresponding display device.

When a display operation is to be performed, first, a TFT is turned on to apply a voltage to the electrode of the display device through the drain electrode. In order to retain the applied voltage even when the TFT is turned off thereafter, one of the drain electrode and the electrode of the display device is provided such that a capacitor is formed between another electrode opposing that electrode.

However, when an electrophoretic device in which particles are charged as described above is used or when a device having spontaneous polarization, which is represented by a ferroelectric liquid crystal is used, the following problem occurs.

That is, when the device is driven by a switching device such as a TFT in a state where charges are retained by a capacitor provided in each pixel, an amount of charges retained thereby is changed by a movement of the charges or by polarization inversion, to significantly reduce apparent voltage retention. As a result, it becomes difficult to maintain a desirable write state.

When data is to be written into each of pixels arranged in matrix, charges are stored in a capacitor (hereinafter referred to as auxiliary capacitor) provided in each of the pixels during a write time.

After charging, a pixel driving voltage is retained by the charges stored in the auxiliary capacitor of each of the pixels to perform rewriting.

When the Charged Electrophoretic Device (charged particles) described above is used or when the device having spontaneous polarization is used, the movement of the charges or the polarization inversion is caused in the device by rewriting, so the amount of charges stored in the capacitor changes.

When the amount of charges reduces before a sufficient change is caused in the device, a write state does not reach a desirable state and thus remains at an intermediate state.

Such a phenomenon appears more significantly as the resolution of a display increases. This is because an area for forming the auxiliary capacitor becomes smaller.

When the phenomenon is viewed in an actual device structure, the problem becomes clearer.

FIG. 3 is a cross sectional view illustrating a pixel electrode in a case where a thin film transistor (TFT) matrix array is formed on a glass substrate.

A gate electrode 11 and an auxiliary capacitor (Cs) electrode 12 are formed on a glass substrate 10, and then a gate insulating film 13 is formed thereon. After that, an amorphous silicon layer 14, an ohmic contact layer 18, a source electrode 15, and a drain electrode 16 are stacked in the stated order. A channel protective film 17 is formed on an uppermost surface.

An auxiliary capacitor Cs includes the auxiliary capacitor electrode 12, the drain electrode 16, and the gate insulating film 13 sandwiched therebetween.

In a case of a high-resolution display, that is, a display whose pixel area is small, an area of the auxiliary capacitor electrode 12 is small, so the auxiliary capacitor Cs is small. Therefore, the amount of charges stored with respect to the same applied voltage reduces.

When the auxiliary capacitor proportionally becomes smaller with a reduction in area of a display device included in a pixel, there is no problem. However, an area occupied by a TFT switching device and a matrix wiring which are formed on the same substrate does not reduce proportional to the auxiliary capacitor. Therefore, the auxiliary capacitor is reduced to a size equal to or smaller than a pixel area ratio as the resolution of the display increases.

In order to be able to normally drive a pixel even when the resolution increases, the followings are expected.

(1) A potential of the auxiliary capacitor electrode 12 is modulated to increase the amount of charges for retention.

(2) A process design rule is changed.

(3) A driving voltage is increased.

However, in the case of (1), a cost of a peripheral circuit increases and a driving method is limited. In the case of (2), it is necessary to improve alignment precision among wirings or layers. In the case of (3), an increase in cost of the peripheral circuit is caused by the improvement of a withstanding voltage. It is difficult to apply any method to a high-resolution display.

SUMMARY OF THE INVENTION

The present invention has been made in view of the above-mentioned circumstances. An object of the present invention is to provide a display apparatus in which necessary auxiliary capacitors can be easily realized to normally drive respective pixels even when resolution is increased.

According to the present invention, a display apparatus includes an electroconductive layer formed in a plane shape on a substrate, an insulating layer formed on the electroconductive layer, plural wirings formed in matrix on the insulating layer, semiconductor devices arranged in respective intersection regions of the plural wirings, and pixels applied with signals through the semiconductor devices. An auxiliary capacitor is formed by each of electrodes of the semiconductor devices which are used to apply the signals to the pixels, and the electroconductive layer.

According to the present invention, the electroconductive layer, which forms the auxiliary capacitor with each of the electrodes of the semiconductor devices which are used to apply the signals to the pixels, is formed on the substrate in the plane shape, that is, in a state where no patterning is performed. Therefore, the position alignment between the electrode of each of the semiconductor devices and the electroconductive layer can be significantly simplified. An area for electrical capacitor formation is determined by the size precision of the electrode opposed to the plane-shaped electroconductive layer, so a variation in electrical capacitance (electrostatic capacitance) can be minimized as much as possible. Therefore, the position alignment between the electrodes is very easy and thus a necessary auxiliary capacitance can be easily realized. Even when the resolution increases, each pixel can be driven in a desirable state.

Further features of the present invention will become apparent from the following description of exemplary embodiments with reference to the attached drawings.

BRIEF DESCRIPTION OF THE DRAWINGS

FIGS. 1A and 1B illustrate an electrophoretic display apparatus according to an embodiment of the present invention, in which FIG. 1A is a cross sectional view illustrating a display device formed on a TFT substrate (backplane) made of an electroconductive material and FIG. 1B is an enlarged cross sectional view illustrating a region enclosed by a broken line B of FIG. 1A.

FIGS. 2A and 2B illustrate the TFT backplane according to the embodiment of the present invention, in which FIG. 2A is a cross sectional view illustrating a principal part of the electrophoretic display apparatus and FIG. 2B is a schematic plan diagram illustrating a part of a TFT active matrix array.

DESCRIPTION OF THE EMBODIMENTS

Hereinafter, a display apparatus according to the present invention in which an electroconductive layer is formed on a surface of a substrate will be described with reference to the attached drawings.

Figure 1A:
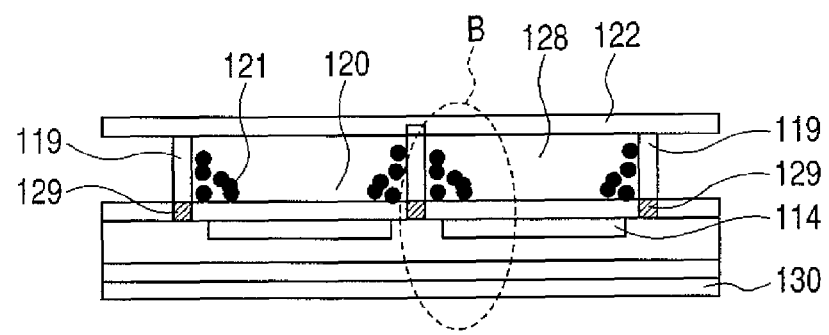
Figure 1B:
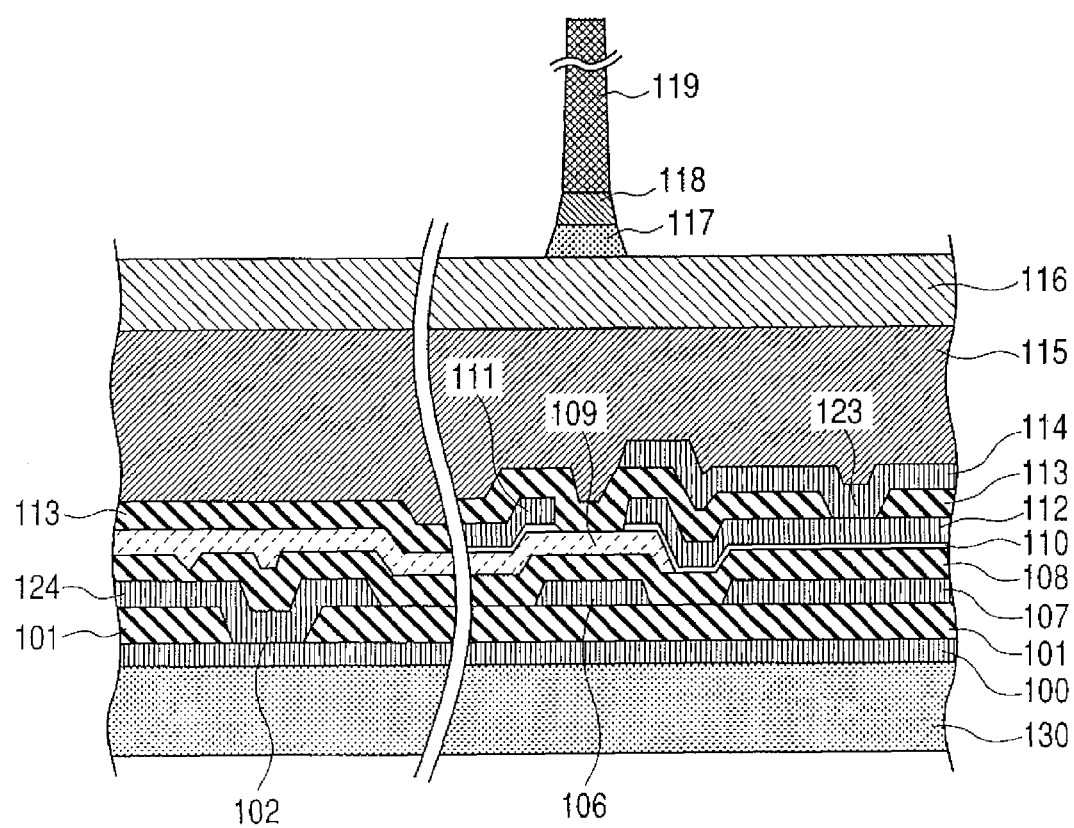

FIGS. 1A and 1B are cross sectional views illustrating an electrophoretic display apparatus according to an embodiment of the present invention. FIG. 1A schematically illustrates a display device according to this embodiment in which a substrate electroconductive layer made of an electroconductive material is formed on the surface. FIG. 1B is an enlarged view illustrating a region enclosed by a broken line B of FIG. 1A.

In the electrophoretic display apparatus, an electrophoretic liquid and electrophoretic particles are sandwiched between a TFT backplane 130 and a counter substrate 122. A first electrode 114 of an electrophoretic display device is provided above the TFT backplane and connected with a drain electrode 112 of a TFT. The electrode of the electrophoretic display device expands over the entire electrophoretic display device and thus is normally larger than the drain electrode.

A second electrode 129 of the electrophoretic display device is provided to a bottom portion of a partition wall 119 in the electrophoretic display apparatus illustrated in FIG. 1A.

Figure 2A:
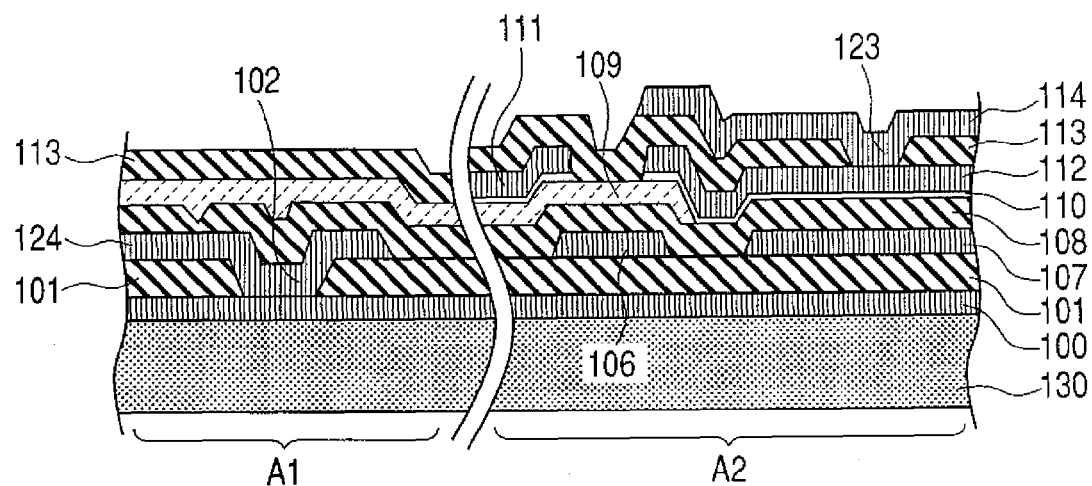
Figure 2B:
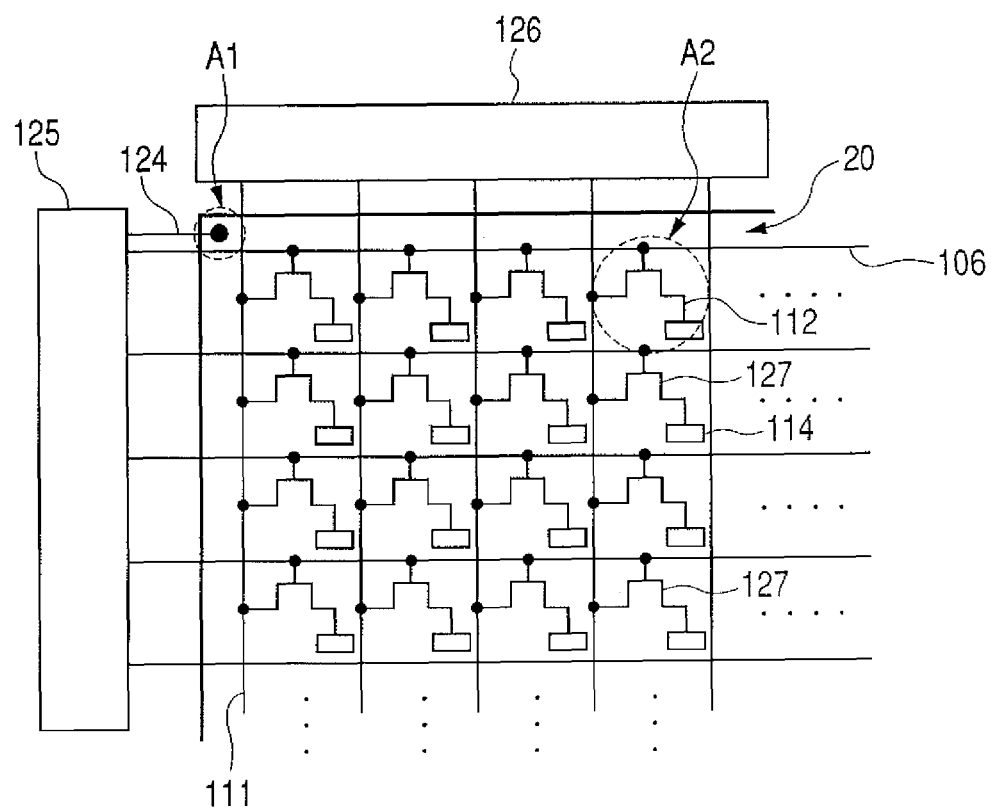
Figure 3:
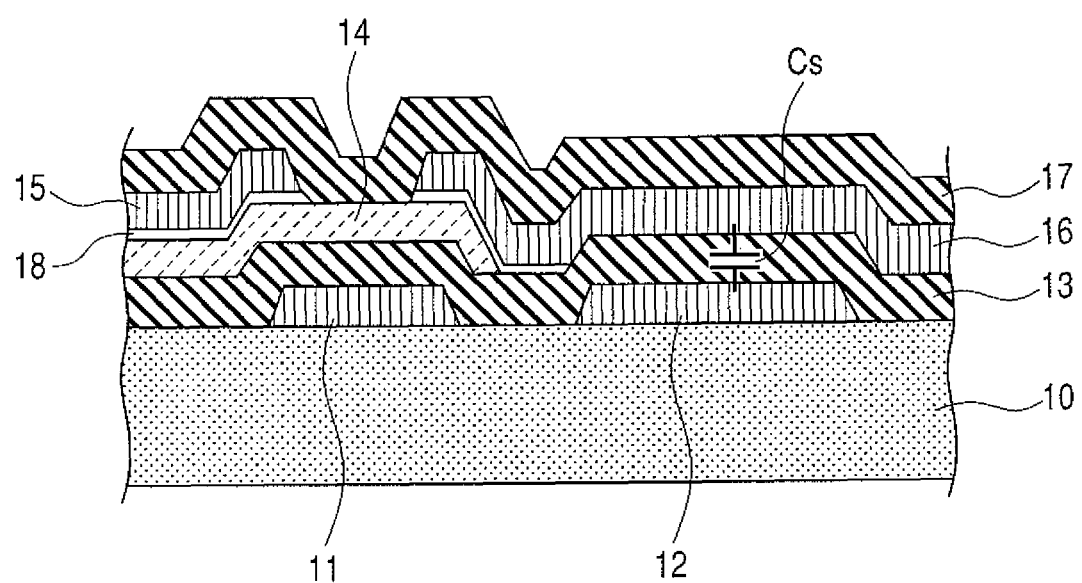
FIG. 3 is a cross sectional view illustrating an example of a pixel electrode in a case where a TFT matrix array is formed on a glass substrate.
Figure 4A:
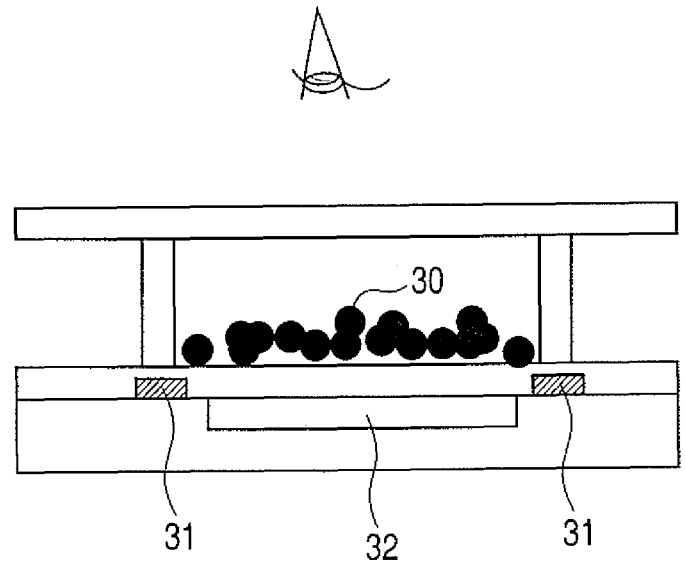
FIGS. 4A and 4B are cross sectional views illustrating a conventional electrophoretic display apparatus.
Figure 4B:
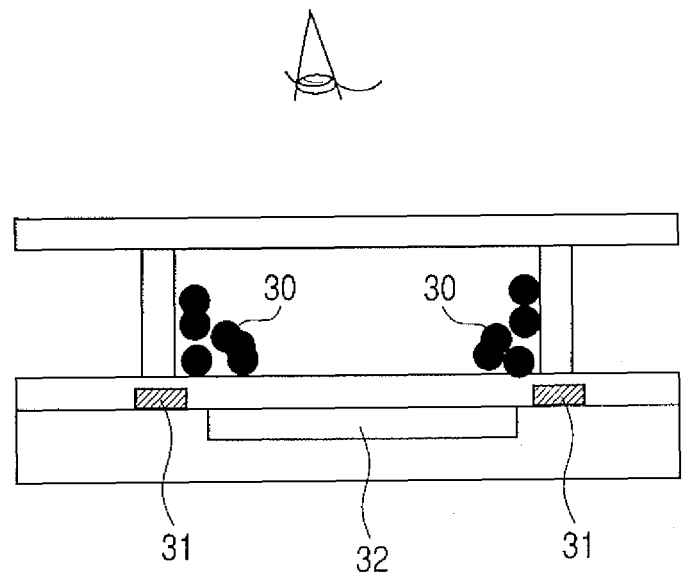

FIG. 2A is an enlarged view illustrating a region of the TFT substrate of the electrophoretic display apparatus of FIGS. 1A and 1B. FIG. 2B is a plan diagram illustrating the electrophoretic display apparatus of FIGS. 1A and 1B, which schematically illustrates a part of an active matrix array.

Regions indicated by A1 and A2 in FIG. 2A correspond to cross sections of parts A1 and A2 enclosed by respective broken lines in FIG. 2B.

Hereinafter, in this embodiment, a bottom-gate thin film transistor (TFT) included in the part A2 of FIG. 2B will be exemplified.

As illustrated in FIG. 2A, the electrophoretic display apparatus (thin type display) according to this embodiment is formed on a substrate in which the entire glass substrate 130 is coated with a base metal layer (SUS substrate) 100 which is a substrate electroconductive layer, and the entire region of the base metal layer 100 is coated with a substrate insulating layer 101 made of, for example, SiN.

The substrate insulating layer 101 is selectively etched in the region A1 to form a contact hole 102 through which the base metal layer 100 is exposed.

Subsequently, a gate electrode (gate wiring) 106, an auxiliary capacitor electrode 107, and a terminal electrode 124 connected with the base metal layer 100 are formed. The electrodes are collectively formed by a one-time electrode metal film formation process and a subsequent photolithography patterning process.

Although the detailed description related to a wiring forming method is omitted here, for example, the method is performed as follows. In a case where an Al wiring whose resistivity is low is used, when a subsequent process includes a process performed at a temperature which exceeds the melting point of Al, a film made of one of chromium (Cr), tantalum (Ta), and aluminum-neodymium (Al—Nd) is deposited by sputtering. Then, an applied resist is selectively exposed and developed. A formed electroconductive film is etched to obtain the wiring.

The auxiliary capacitor electrode 107 included in a pixel capacitor is provided in the same layer as the gate electrode. However, the auxiliary capacitor electrode 107 is independently provided without being electrically connected with the gate electrode or any of other TFT electrodes, and is thus supplied with a constant potential. The base metal layer 100 is supplied with a constant potential. The base metal layer 100 can be also maintained at the same potential as that of the auxiliary capacitor electrode 107 included in the pixel capacitor.

A gate insulating film 108 is formed on a substrate on which the gate wiring 106 is formed.

After that, an amorphous semiconductor layer 109 is formed. An ohmic contact layer 110 is formed on the amorphous semiconductor layer 109 by an ion injection method.

Next, a metal film for a source electrode 111 and a drain electrode 112 are formed and patterned together with the ohmic contact layer 110 and the amorphous semiconductor layer 109.

At this time, a resist located on a channel region (region just above the gate electrode 106) of the amorphous semiconductor layer 109 is left without being etched. After that, the resist is peeled and only a portion of the ohmic contact layer which is provided on the channel region is removed by etching.

Finally, a channel protective layer 113 is formed to complete the TFT backplane.

As described above, according to the present invention, the substrate in which the electroconductive thin metal plane (base metal layer 100) is coated with the substrate insulating layer 101 is produced and the TFT is formed on the substrate.

The base metal layer 100 is connected with an external power source through the terminal electrode 124 to hold a potential thereof.

A capacitor is formed by the base metal layer 100 serving as an electroconductive thin metal plane, the drain electrode 112, and the substrate insulating layer 101 and the gate insulating film 108 which are sandwiched between the base metal layer 100 and the drain electrode 112. As in a case of the conventional TFT, a capacitor is formed by stacking the pixel capacitor electrode (auxiliary capacitor electrode) 107, the drain electrode 112, and the gate insulating film 108 sandwiched therebetween.

In other words, a first auxiliary capacitor is electrically formed by the drain electrode 112 and the pixel capacitor formation electrode (auxiliary capacitor electrode) 107, and a second auxiliary capacitor is formed by the drain electrode 112 and the base metal layer 100 in a region in which the drain electrode 112 and the auxiliary capacitor electrode 107 are not opposed to each other. The drain electrode 112 is connected with a pixel electrode (reference numeral 114 in FIGS. 2A and 2B) of a display device corresponding to a pixel, so the second auxiliary capacitor is also formed by the pixel electrode 114 and the base metal layer 100.

The pixel electrode 114 of the display device is normally larger in size than the drain electrode 112, so the pixel electrode 114 is opposed to the drain electrode 112 and further expands to a region wider than the region in which the first capacitor is formed. Therefore, the pixel electrode 114 is opposed to the base metal layer 100 over the entire expansion region to form the second capacitor. The second auxiliary capacitor is formed in addition to the conventional first auxiliary capacitor, so a sufficient auxiliary capacitance can be obtained even in the case where the pixel area is small. Thus, a high-resolution display structure can be realized.

As illustrated in FIG. 2B, a display panel (TFT backplane) 20 includes a matrix substrate in which the gate electrodes 106 and the source electrodes 111 are arranged in a matrix.

Each of intersection regions (cross regions) of the plural gate electrodes 106 extending in a row direction and the plural source electrodes 111 extending in a column direction includes a TFT 127 which is a semiconductor device and the pixel electrode 114 (pixel) applied with a voltage (signal) through the TFT 127, which are connected with each other. The base metal layer 100 of the display panel 20 is electrically connected with the substrate potential holding wiring (terminal electrode) 124 for controlling a substrate potential of the base metal layer 100 through the contact hole 102 for the substrate insulating layer.

The display panel 20 further includes a gate line driving circuit (first unit) 125 for driving the gate electrodes 106 serving as scanning signal wirings and a source line driving circuit (second unit) 126 for driving the source electrodes 111 serving as information signal wirings. The gate line driving circuit 125 and the source line driving circuit 126 constitute a driving unit. For example, with respect to a gate line driving voltage from the gate line driving circuit 125, an on-voltage and an off-voltage can be set to +20 (V) and −20 (V), respectively. A source line driving voltage from the source line driving circuit 126 can be set to 0 (V) to 15 (V).

In this embodiment, the potential of the base metal layer 100 serving as a base electrode is made equal to a potential Vcom corresponding to a reference potential which is electrically opposed to potentials of the respective pixel electrodes 114 in the TFT panel through the contact hole 102 provided in the substrate insulating layer 101 provided on the base metal layer 100.

Up to now, when an auxiliary capacitor (pixel capacitor) is formed, a first electrode and a second electrode which are used to sandwich an insulating film have been formed in an arbitrary shape. Therefore, there have been cases where the respective electrodes are displaced in position from each other to change a size of the produced pixel capacitor. In order to prevent this, a size of one of the electrodes is made larger than a size of the other. Thus, even when position displacement occurs, an auxiliary capacitance does not change.

In this embodiment, the base metal layer 100 opposed to the drain electrode 112 is an unpatterned electroconductive layer which is formed on the entire surface of the glass substrate 130. Therefore, fine alignment is unnecessary and the second auxiliary capacitor can be determined by only a size of one of the drain electrode 112 and the pixel electrode 114, with the result that a wide design margin can be obtained.

In other words, the area for electrical capacitor formation is determined by the size precision of the drain electrode 112 opposed to the plane-shaped base metal layer 100, so a variation in electrical capacitance (electrostatic capacitance) can be minimized as much as possible.

Therefore, the position alignment between the electrodes is very easy and thus a necessary auxiliary capacitance can be easily realized. Even when the resolution increases, each pixel can be driven in a desirable state.

As in the conventional case, a voltage auxiliary capacitor is formed by the drain electrode 112 and the auxiliary capacitor electrode 107. Therefore, the auxiliary capacitance can be increased to a value larger than that in the conventional case without changing the formation of the conventional TFT backplane and the number of patterns. As a result, even in the case of a high-resolution display in which the charged particles are used for the display device, preferable image quality can be obtained.

In this embodiment, the backplane of the electrophoretic display apparatus is manufactured. However, the present invention is not limited thereto.

The present invention can be applied to a transmission liquid crystal display apparatus in which a liquid crystal layer (electro-optical modulator) is sandwiched between the substrates 122 and 130 which are opposed to each other.

When the present invention is applied to the liquid crystal display apparatus, a transparent electroconductive film made of, for example, ITO is formed on the second substrate (glass substrate) 122 to obtain a common electrode. The liquid crystal layer is sandwiched between the second substrate 122 and the drain electrode 112. A desirable electric field is applied between the drain electrode and the common electrode to perform display. At least one of the pair of substrates 122 and 130 (substrate 130 side in this embodiment) includes a pair of electrodes (base metal layer 100 and drain electrode 112), so a large auxiliary capacitance is obtained. Therefore, a voltage applied to the liquid crystal layer becomes uniform and stable.

In this embodiment, the inverse staggered bottom-gate TFT structure using amorphous silicon is described. A top-gate TFT structure can also be employed. In this case, a capacitor can be formed by the base metal layer 100, one of the drain electrode and the source electrode, and the substrate insulating layer 101 coating the base metal layer 100 and is sandwiched therebetween. In addition, a capacitor can be formed by the base metal layer 100, the gate electrode, and at least one of the amorphous semiconductor layer and the gate insulating layer provided thereon, which is sandwiched therebetween.

In this embodiment, the auxiliary capacitor for TFT retention driving is formed by the pixel electrode 114 or the drain electrode 112 connected therewith, and the base metal layer 100. As in the conventional case, the pixel capacitor electrode 107 is formed in the same layer as the gate wiring 106. Different constant potentials may be applied to the pixel capacitor electrode 107 and the base metal layer 100. For direct connection, the same contact hole as that denoted by reference numeral 102 in FIG. 2A may be formed in the substrate insulating layer 101.

The potential of the base metal layer 100 may be any of constant potentials. The potential of the base metal layer 100 may be made equal to the potential Vcom corresponding to the reference potential which is electrically opposed to potentials of the respective pixel electrodes in the TFT panel. The connection can be made such that the potential of the base metal layer 100 becomes equal to any of power source potentials used to drive display devices.

The potential of the base metal layer 100 can also be set to any of power source potentials used for the gate line driving circuit 125 illustrated in FIG. 2B.

In this embodiment, in order to manufacture a reflection display, a metal layer whose transmittance is low is employed as the base metal layer (base electrode) 100. However, the present invention is not limited thereto. An electroconductive film in which the problem does not occur in subsequent processes is desirable. For example, when a transmission display is to be manufactured, a so-called transparent electrode made of a material represented by indium tin oxide (ITO) may be used.

A TFT (three-terminal transistor) including the semiconductor layer (active layer, channel region) 109 made of amorphous silicon can be used. The semiconductor layer 109 may be converted into a polysilicon layer by laser annealing.

The present invention can also be applied to a TFT using a transfer technique for a single crystalline TFT in the same manner.

EXAMPLE

FIGS. 1A and 1B illustrate the electrophoretic display apparatus according to an example of the present invention.

Each of spaces 128 specified by the partition walls 119 is filled with an electrophoretic liquid. The pixel electrode (reflection electrode) 114 is provided under each of the spaces. The common electrode (second electrode) 129 is provided to the bottom portion of each of the partition walls 119. The common electrode 129 is maintained at a constant potential. A write voltage is applied between the common electrode 129 and the pixel electrode 114 to move electrophoretic particles 121.

Hereinafter, a method of manufacturing the electrophoretic display apparatus illustrated in FIGS. 1A and 1B will be described.

(1) A Cr layer (base metal layer 100) having a thickness of 100 (nm) is formed by sputtering on the glass substrate 130 having a plate thickness of 0.7 (mm).

(2) An SiN film serving as the substrate insulating layer 101 is formed on the Cr electrode (base metal layer 100) at a thickness of 300 (nm) by a chemical vapor deposition (CVD) method.

(3) The contact hole 102 is formed in the substrate insulating layer 101 by dry etching to expose a portion of the base metal layer (Cr electrode) 100.

(4) An AlNd layer is formed on the substrate insulating layer (SiN film) 101 at 200 (nm) by sputtering. Then, the gate wiring 106 and a lower electrode of a TFT of the auxiliary capacitor electrode 107 are formed using a photomask.

The Substrate Potential Holding Wiring (terminal electrode) 124 is formed simultaneously with the formation of the gate wiring 106 and the auxiliary capacitor electrode 107. The substrate potential holding wiring 124 is electrically connected with the base metal layer (Cr electrode) 100 through the contact hole 102 to hold the substrate potential.

In this example, when a driver IC (gate line driving circuit 125) is mounted in a subsequent process, the potential of the substrate potential holding wiring 124 is made equal to the potential Vcom corresponding to the reference potential which is electrically opposed to the potential of the pixel electrode 114 in the panel. When the potential of the base metal layer 100 is electrically held, an electrical capacitor (auxiliary capacitor) can be formed by the base metal layer 100 and the drain electrode 112.

(5) An SiN film having a thickness of 250 nm and an a-Si film having a thickness of 200 nm are formed by a CVD method as the gate insulating film 108 and the semiconductor layer 109, respectively.

(6) An a-Si($n^+$) film having a thickness of 20 (nm) is formed as the ohmic contact layer 110 by the CVD method.

(7) An Al layer having a thickness of 200 (nm) is formed on the ohmic contact layer 110 by sputtering.

(8) The source wiring 111 and the drain electrode 112 which cover the TFT region are formed by wet etching using a photomask. Subsequently, the same resist pattern is used to remove a portion of the ohmic contact layer (a-Si($n^+$) film) 110 which is located above the TFT channel region by dry etching. After that, an SiN film (channel protective layer) 113 is formed at a thickness of 300 (nm).

(9) A contact hole 123 is formed in the SiN film (channel protective layer) 113 by dry etching to expose a portion of the drain electrode 112.

(10) An Al layer having a thickness of 200 (nm) is formed on the SiN film 113 by sputtering.

(11) The Al layer is wet-etched using a photomask to form the pixel electrode 114.

(12) An acrylic resin layer containing $TiO_2$ is applied at 4 (μm) to form a white scattering layer 115.

(13) An acrylic resin layer 116 having a thickness of 1 (μm) is formed as an insulating film.

(14) A Ti layer 117 having a thickness of 300 (nm) is formed on the acrylic resin layer 116 and then a photoresist 118 containing carbon is formed at a thickness of 300 (nm).

(15) A thick film photoresist is formed at a thickness of 15 (μm) and then a region other than an interpixel region is developed to form the partition walls 119.

(16) The Ti layer 117 and the photoresist 118 containing carbon are etched by 300 (nm) using the partition walls 119 formed by the thick film photoresist, thereby forming the TFT backplane.

(17) Finally, the spaces 128 specified by the partition walls 119 are filled with a dispersion liquid in which black chargeable particles (electrophoretic particles) 121 made of polystyrene resin containing carbon black are dispersed into an insulating liquid 120 containing a paraffinic hydrocarbon solvent as a main ingredient. Then, the second substrate 122 which is transparent is fixed to the partition walls 119 in contact therewith. In other words, the second substrate 122 and the glass substrate 130 are opposed to each other in a state where the chargeable particles (electrophoretic particles) 121 and a dispersion liquid which is a solvent for dispersing the chargeable particles 121 are sandwiched therebetween. Although not illustrated for simplification, the second substrate 122 is fixed to the partition walls 119 by an adhesive.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This Application Claims Priority from Japanese Patent Application No. 2006-157996 filed on Jun. 7, 2006, which is hereby incorporated by reference herein.

What is claimed is:

1. A display apparatus comprising:
  a substrate;
  an electroconductive layer provided on the substrate;
  an insulating layer covering the electroconductive layer;
  a semiconductor device including a drain electrode, a semiconductor, a gate electrode, and a source electrode, the semiconductor device also comprising a thin film transistor device in which the gate electrode, the semiconductor, and the source/drain electrodes are stacked in the stated order from a substrate side;
  a display device including an electrode which is connected with the drain electrode of the semiconductor device; and
  a capacitor electrode provided over the electroconductive layer which is covered with the insulating layer,
  wherein, in an in-plane direction of the substrate, at least a part of the electroconductive layer is closer to a semiconductor device side than the capacitor electrode, and
  wherein the electrode of the display device and the drain electrode of the semiconductor device which is connected with the electrode of the display device form a first capacitor with the capacitor electrode and a second capacitor with the electroconductive layer.

2. The display apparatus according to claim 1, wherein the electroconductive layer has a potential equal to a potential of the capacitor electrode.

3. The display apparatus according to claim 1, wherein the display device includes a liquid crystal.

4. The display apparatus according to claim 1, wherein the display device includes electrophoretic particles.

5. The display apparatus according to claim 1, wherein the display device includes an organic electroluminescence layer.

6. The display apparatus according to claim 1, wherein the semiconductor device, the display device, and the capacitor electrode are provided over the electroconductive layer.

7. The display apparatus according to claim 1, wherein the electroconductive layer and the capacitor electrode are held at a potential.

* * * * *